United States Patent [19]
Yang et al.

[11] Patent Number: 6,043,109
[45] Date of Patent: Mar. 28, 2000

[54] METHOD OF FABRICATING WAFER-LEVEL PACKAGE

[75] Inventors: Te-Sheng Yang, Taipei; Kai-Kuang Ho, Kaohsiung Hsien, both of Taiwan

[73] Assignee: United Microelectronics Corp., Hsinchu, Taiwan

[21] Appl. No.: 09/247,230

[22] Filed: Feb. 9, 1999

[51] Int. Cl.[7] .................................................. H01L 21/44
[52] U.S. Cl. ........................... 438/113; 438/109; 438/118
[58] Field of Search ................................. 438/107, 109, 438/113, 114, 118; 257/723, 724, 725

[56] References Cited

U.S. PATENT DOCUMENTS

| | | | |
|---|---|---|---|
| 5,049,979 | 9/1991 | Hashemi et al. | 257/723 |
| 5,331,235 | 7/1994 | Chun | 257/723 |
| 5,422,435 | 6/1995 | Takiar et al. | 438/109 |
| 5,528,083 | 6/1996 | Malladi et al. | 257/723 |
| 5,858,815 | 1/1999 | Heo et al. | 438/112 |
| 5,869,896 | 2/1999 | Baker et al. | 257/724 |
| 5,879,964 | 3/1999 | Paik et al. | 438/113 |
| 5,915,169 | 6/1999 | Heo | 438/118 |

*Primary Examiner*—Kevin M. Picardat

[57] ABSTRACT

A method of fabricating wafer-level package. The package is applicable in packing at least two dies. The volume of the package is approximately equal to the total volume of the packed dies. A first die is provided. A pad redistribution step is performed on the first die. After performing a pad redistribution step on the first die, an insulator is formed on a peripheral region over the first die. The insulator prevents from contaminating a central region circumscribed by the insulator over the first die during the subsequent molding or coating step. The first die is adhered onto a second die with an insulating tape or non-conductive glue. Using a bonding technique, metal wires are bonded to connect the first die and the second die, so as to transmit the signal and conduct the electricity between the first and the second dies. Using molding or coating, the metal wires are fixed and protected. Soldering balls are formed on the central region over the first die to provide terminals for connecting an external device or circuit.

17 Claims, 3 Drawing Sheets

METHOD OF FABRICATING WAFER-LEVEL PACKAGE

BACKGROUND OF THE INVENTION

1. Field of the Invention

The invention relates to a method of fabricating a semiconductor packaging structure, and more particularly, to a method of fabricating a wafer-level package with a chip scale (size).

2. Description of the Related Art

As the technology of semiconductor fabrication grows more and more advanced, the relevant techniques have to be further developed to coordinate the requirements of the semiconductor devices. The fabrication process of a semiconductor device typically includes three stages. In the first stage, an epitaxy technique is used for the formation of a semiconductor substrate. Semiconductor devices such as metal-oxide semiconductor (MOS) and multilevel interconnection are fabricated on the substrate in the second stage. The third stage is the packaging process. It is now a leading trend for fabricating a device or an electronic product with a thin, light, and small dimension, that is, with a higher integration for semiconductor devices. In terms of packages, many techniques such as chip scale package or chip size package, multi-chip module (MCM) have been developed to obtain a high integration. The development of the fabrication technique with a line width of 0.18 µm has evoked a great interest and intensive research to further decrease the package volume. It is thus one of the very important package techniques to arrange more than one chips into a single package. In a package comprising more than one chip, those chips such as microprocessor, memory, including dynamic random access memory (DRAM) and flash memory, and logic circuit can be packed together in a single package to reduce the fabrication cost and the packaging volume. Furthermore, the signal transmission path is shortened to enhance the efficiency. The multi-chip IC packaging technology may also be applied to a multi-chip system with variable functions and operation frequencies, for example, 1. A system comprises memory chips, microprocessors, resistors, capacitors, and inductors.

2. A system comprises memory chips (DRAM), logic circuit chips, and memory chips (Flash memory), 3. A system comprises analog chips, logic circuit chips, memory chips (including DRAM, SRAM, Flash memory), resistor, capacitor, and inductor.

In FIG. 1, a conventional dual-chip module is shown. A substrate 10 comprising a copper pattern 12 is provided. By means of the formation of solder balls 14, the electrical connection to an external device or circuit is established. A very popular material of the substrate is polyimide. A die 18 with a larger size is adhered onto the substrate 10 with an insulating layer 16 as a glue layer in between. An insulating layer 20 and a die 22 with a smaller size is then disposed on the insulating layer 16. Conductive wires 24 are formed to electrically collect the dies 18, 22 and the substrate 10. Using resin 26, the dies 18 and 22 and the substrate 10 are molded. The electrical connection between the whole package and a printed circuit board can be achieved by ball grid array (BGA) which use solder balls 14 to connect the terminals on the printed circuit board. The drawback of this conventional dual-chip module includes a large surface area occupied since dies are packaged on a same side of surface. Therefore, the volume of the package is large, and the signal path between chips is long.

To further shrink the volume of package, a face to face multi-chip package is disclosed in U.S. Pat. No. 5,331,235. This multi-chip package uses tape automatic bonding technique. The electrical connection between chips and printed circuit board is achieved by the installation of a lead frame or other carriers. The signal transmission path is lengthened. In addition, a large thickness and surface area are resulted by using the molding material (resin) of package. The applicability is reduced, and the heat dissipation is not effective. Moreover, this kind of package can not be applied to high frequency products.

SUMMARY OF THE INVENTION

The invention provides a method of fabricating a wafer-level chip scale package. Dies are connected to each other by an insulating tape or a non-conductive glue without using a carrier. Thus, the volume occupied by the carrier in the conventional structure is saved. A molding or coating material is formed only surrounding an insulator formed on a peripheral region of a die. Thus, the conductive wires formed over the region are fixed and protected without consuming a lot of molding or coating material to increase the volume of the package. More specifically, the thickness of the package is approximately the same as the total thickness of the dies packed into the package, and the surface area of the package is about the same of that of the die with a larger surface area in the package.

The insulator formed on the peripheral region of a die can relieve the stress induced by the formation of the molding or coating material. In addition, with the insulator, a region circumscribed thereby, that is, the region predetermined to form soldering balls are protected from being polluted or contaminated by the molding or coating material.

In the invention, the conductive paths between the dies and an external circuit or device are designed via three ways. 1. Using bonding or other method, the signal can be transmitted from a larger die to solder balls via a pad redistribution layer of a smaller die. 2. The signal of the smaller die can be transmitted to the soldering balls through the pad redistribution thereof. 3. By way of the metal wires formed by bonding or other method, the larger die can be conducted to the smaller die through the pad redistribution layer. By this design, three conductive paths are established to flexibly increase memory capacity, and to switch the product functions.

To achieve the above-mentioned objects and advantages, a method of fabricating a wafer-level chip scale package is provided. A first die is provided. A pad redistribution layer is formed on the first die. An insulator is formed on a peripheral region of the pad redistribution layer. The first die is adhered onto a second die with an insulating tape or a non-conductive glue. Using bonding or other method, electrical connection between the first die and the second die is achieved by forming a metal wire. The metal wire is then protected and fixed by a molding or coating material. Soldering balls are formed onto a central region of the pad redistribution layer.

Both the foregoing general description and the following detailed description are exemplary and explanatory only and are not restrictive of the invention, as claimed.

DESCRIPTION OF THE PREFERRED EMBODIMENTS

The invention provides a wafer-level chip scale package. A pad redistribution step is performed on a smaller die. That is, the path of signal input/output (I/O) of the smaller die is rearranged and redistributed as shown in FIG. 2A to FIG. 2B.

Figure 1:
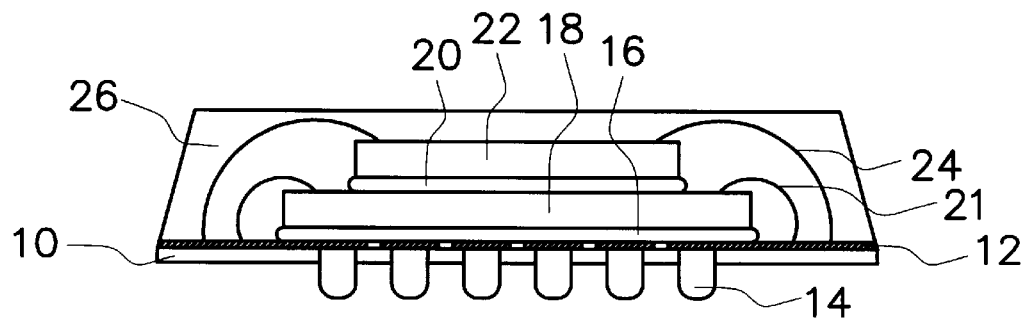
FIG. 1 shows a conventional dual-chip module package.
Figure 2A:
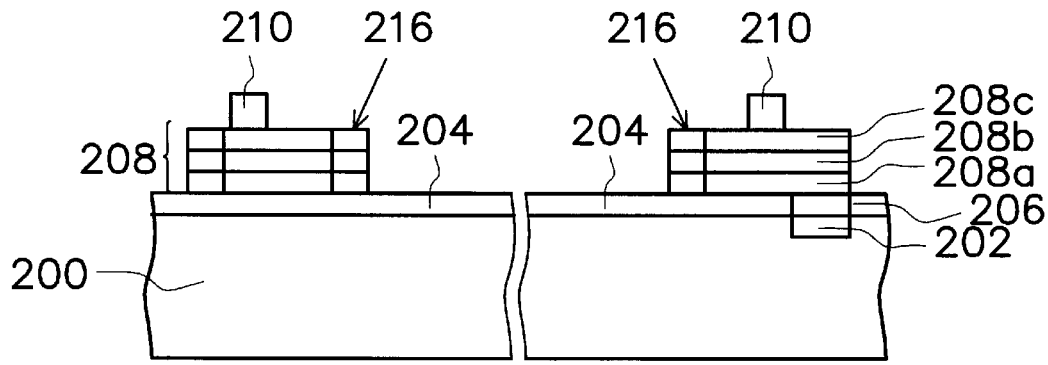
FIG. 2A to FIG. 2B are cross sectional views showing an example of a pad redistribution structure according to the invention.
Figure 2B:
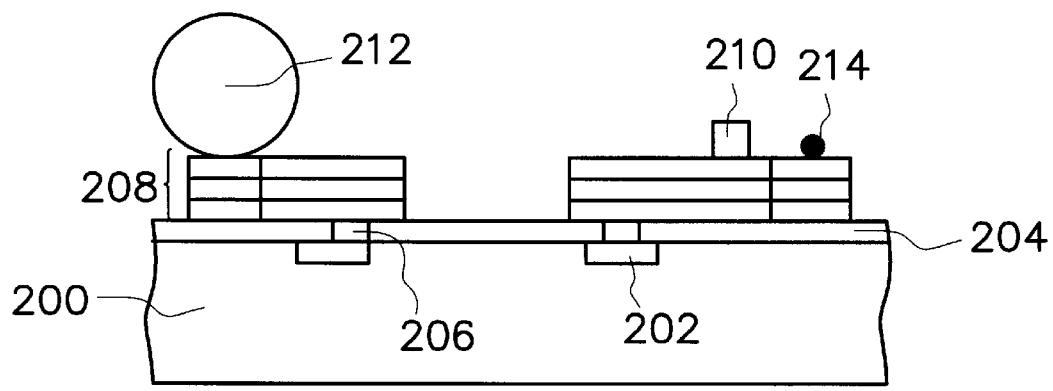

In FIG. 2A, a wafer comprising several dies 200 is provided. Each die 200 comprises at least a bonding pad 202. It is very often that a polyimide layer 204 is formed on the dies 200 to protect the circuit or device formed on the dies 200. A pad redistribution step is performed on the dies 200, so that a pad redistribution layer 208 is formed on the polymide layer 204. Via the formation of a contact 206, the dies 200 can be conducted from the bonding pad 202 to other dies or an external device or circuit via the pad redistribution layer 208. For example, the pad redistribution layer 208 comprises more than one conductive layers, such as a copper layer (Cu) 208a, a nickel layer (Ni) 208b, and a gold layer (Au) 208c. However, the materials and numbers of layers are determined by specific requirements according to circuit or device design. On a peripheral region of the pad redistribution layer 208, an insulator 210 with a pillar shape in cross sectional view is formed. In addition to reduce the stress induced during a subsequent molding or coating process, the insulator 210 further comprises a function to avoid the molding or coating material to enter a region 216 predetermined for forming soldering balls. The region 216 circumscribed by the insulator 210 is protected thereby to avoid being contaminated or polluted.

A die sawing step is then performed on the wafer to separate the dies 200 into individuals. After connecting each of the dies 200 onto another die, metal wires 214 is formed, for example, by a bonding step or other methods, on a region surrounding the insulator 210 of the pad redistribution layer 208 and connected from the die 200 to another die. Soldering balls 212 are then formed on the region circumscribed by the insulator 210 on the pad redistribution layer 208.

By the formation of the metal wires, and soldering balls plus the step of forming pad redistribution conductive paths between dies 200 and from dies 200 to an external device or circuit are established to flexibly increase memory capability or to switch functions of products. Thus, the invention provide a multi-functional package which may comprises a dynamic random access memory (DRAM), a static random access memory (SRAM), a read only memory (ROM), a logic circuit, a flash memory, an application specific integrated circuit (ASIC), or an analog circuit.

Figure 3A:
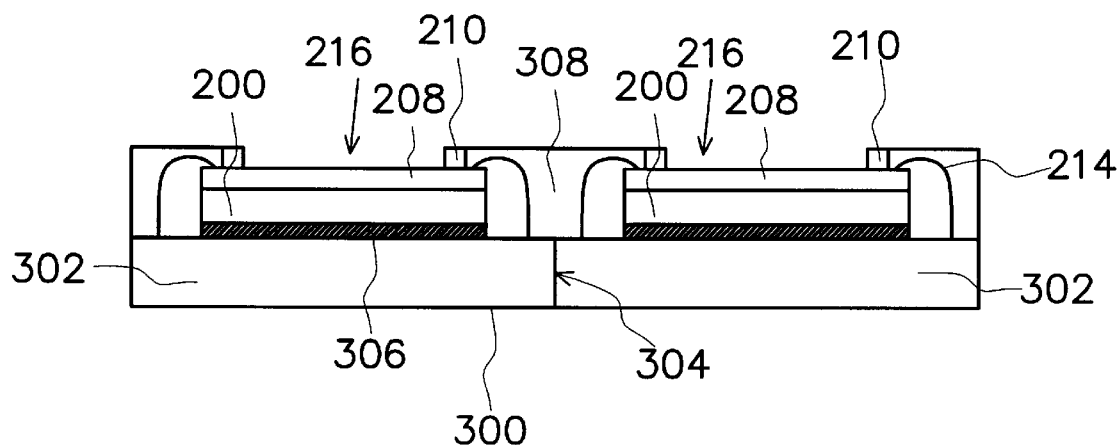
FIG. 3A to FIG. 3C are cross sectional views of a wafer-level chip scale package in drawn according to a preferred embodiment in the invention.
Figure 3B:
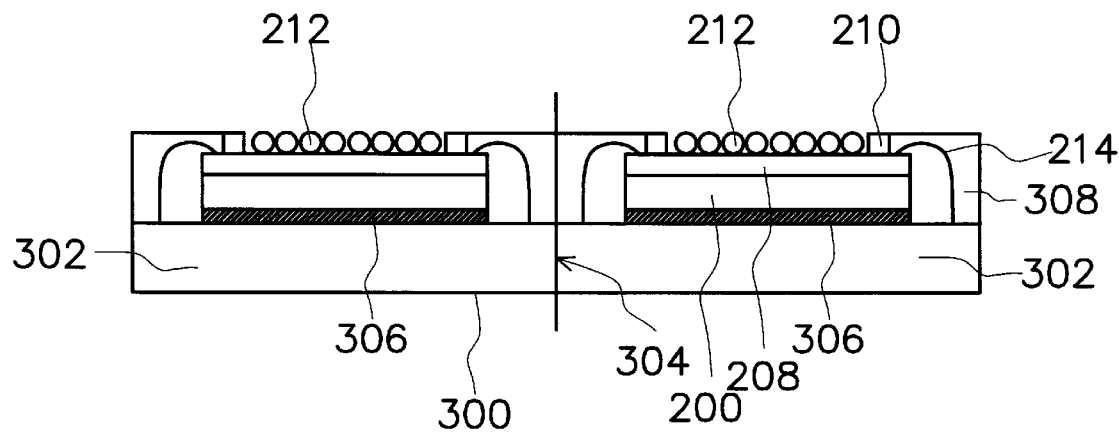
Figure 3C:
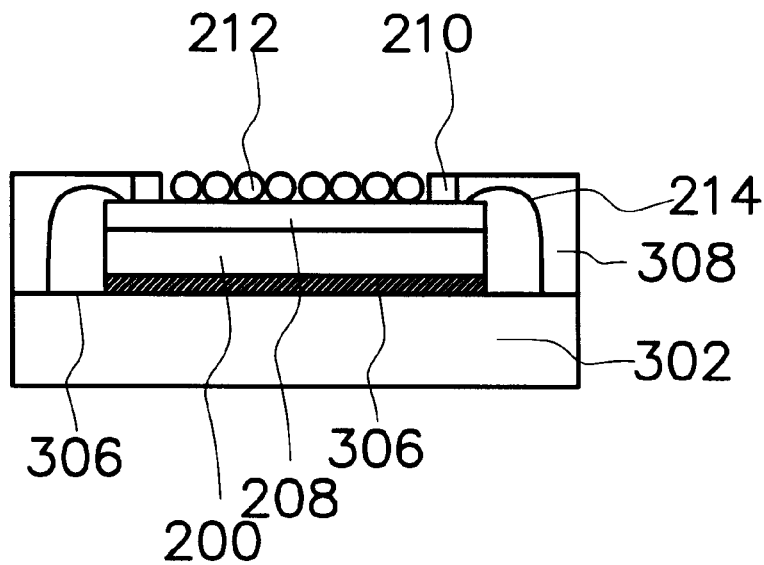

FIG. 3A to FIG. 3C shows a wafer-level package and a method to fabricate thereof. In FIG. 3A, a wafer is provided. The wafer comprises several dies 200. The input/output paths of the dies 200 are rearranged and redistributed to form a pad redistribution layer 208 thereon. A detailed description of the redistribution structure can be referred to FIG. 2A and FIG. 2B. On a peripheral region of the pad redistribution region 208, an insulator 210 is formed. The dies 210 are separated into individuals by a die sawing step.

A wafer 300 is provided. The wafer 300 comprises several dies 302 partitioned with each other by scribe lines 304. In this embodiment, the dies 302 are larger than the dies 200 in surface area. Using an insulating tape or non-conductive glue, a surface without the formation of the pad redistribution layer 208 of each of the dies 200 is adhered onto each of the dies 302. Preferably, a bonding pad 310, for example, an aluminum or other metal bond, is formed on a region of the dies 302 surrounding the dies 200. Metal wires 214 are then connected from the dies 200 to the dies 302 via the bonding pads 310.

Using molding or coating, the region surrounding the dies 200 of the dies 320 and the region surrounding the insulator 210 of the dies 200 are covered by a protection material, for example, a molding material 308 such as a resin. The formation of the molding material 308 comprises functions to fix and protect the metal wires 214. As a consequence, the regions 216 circumscribed by the insulator 210 of the dies 200 are exposed.

In FIG. 3B, soldering balls 212 are formed onto the region 216. Along the scribe lines 304 on the wafer 300, the wafer 300 is sawed into individual packages as shown in FIG. 3C.

Figure 4:
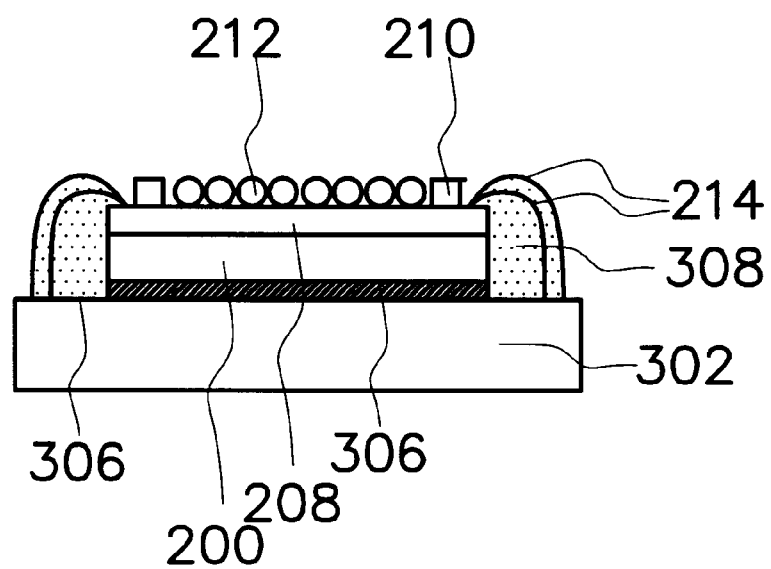
FIG. 4 shows another type of wafer-level chip scale package in the invention.

FIG. 4 shows another package designed by the invention. The fabrication step of is the same as above apart from replacing the molding step by a coating step. That is, the molding material 308 is replaced by a coating material, for example, a liquid compound. As a consequence, only the regions under the metal wires 214 are covered and filled by the coating material.

Thus, the invention provides a wafer-level package with a chip scale or chip size. More specifically, the package has a thickness about the same as the total thickness of two dies packed therein.

A bare wafer type is adapted in the invention, that is, one surface of each die is exposed to provide a directly path to dissipate heat of the dies during operation.

The conductive paths or signal transmitting paths between dies and external devices or circuit comprise:

1. A signal can be transmitted from the die 302 to the soldering balls 212 via the metal wires 214 and the pad redistribution layer 208.

2. A signal of the die 200 can be conducted to the soldering balls 212 via the pad redistribution layer 208, and further conducted externally through the soldering balls 212.

3. A signal of the die 302 can be conducted to the die 200 by the metal wires 214 via the pad redistribution layer 208, and to be further conducted to an external device or circuit by way of the soldering balls 212.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a wafer level package, comprising:

providing a first die;

performing a pad redistribution step on a first surface of the first die;

forming an insulator on a peripheral region over the first surface of the first die, so that a region of the first surface is exposed;

adhering a second surface of the first die onto a second die using an insulating tape or a non-conductive glue;

forming at least one metal wire, to electrically connect the first die and the second die;

performing a molding or coating step to protect and cover the metal wire; and forming a plurality of soldering balls on the region exposed by the insulator over the first surface of the first die.

2. The method according to claim 1, wherein the first die has a surface area smaller than a surface area of the second die.

3. The method according to claim 1, comprising further a step of forming a pad redistribution layer on the first die.

4. The method of claim 3, wherein the step of forming the pad redistribution layer comprises forming more than one conductive layer.

5. The method according to claim 1, wherein the metal wire comprises a gold wire.

6. The method according to claim 1, wherein the molding material comprises resin.

7. The method according to claim 1, wherein the coating material comprises liquid compound.

8. The method of claim 1, wherein the plurality of soldering balls are formed in such a manner that the soldering balls are not separated from one another by the insulator.

9. A method of fabricating a wafer-level package, comprising:

providing a first wafer, the first wafer comprising a plurality of first dies;

forming a pad distribution on each of the first dies;

forming an insulator on the pad distribution on each of the first dies to define a region circumscribed by the insulator for forming a plurality of soldering balls in a subsequent process;

sawing the first wafer to separate each of the first dies;

providing a second wafer, the second wafer comprising a plurality of second dies;

adhering one of the first dies onto each of the second dies;

forming a plurality of metal wires, the metal wires extending from a region surrounding the insulator on the pad redistribution to the second dies;

forming a plurality of protection material only to protect and fix the metal wires;

forming a plurality of soldering balls on the region circumscribed by the insulator over each of the first dies; and sawing the second wafer to separate each of the second dies.

10. The method according to claim 9, wherein the first dies are smaller than the second dies in surface area.

11. The method according to claim 9, wherein the protection materials comprise resin.

12. The method according to claim 9, wherein the protection materials comprise liquid compound.

13. The method of claim 9, wherein the step of forming the pad redistribution comprises forming more than one conductive layer.

14. The method of claim 9, wherein the plurality of soldering balls are formed in such a manner that soldering balls formed on a single die are not separated from one another by the insulator.

15. The method of claim 9, wherein the second wafer is saw into individual second dies along a scribe lines on the second wafer.

16. The method of claim 9, wherein the metal wires extend from the first dies to a plurality of bonding pads formed on the second dies.

17. A method of fabricating a wafer level package, comprising:

providing a plurality of first dies, each of which comprising a pad redistribution layer on a first surface thereof;

forming an insulator on the pad redistribution layer on each of the first dies to expose a central portion and an edge portion of the pad redistribution layer;

providing a plurality of second dies equal to the amount of the first dies, each of the second dies comprising at least a bonding pad;

adhering each of the first dies onto each of the second dies, with the pad redistribution layer and the insulator facing outward;

forming a plurality of soldering balls onto the exposed central portion of the pad redistribution layer, wherein soldering balls formed on a single first die are not separated from one another by the insulator;

forming a plurality of metal wires to couple between the edge portion of the pad redistribution layer and the bonding pad; and molding or coating the metal wires.

* * * * *